United States Patent
Wadle et al.

(10) Patent No.: US 7,220,488 B2
(45) Date of Patent: May 22, 2007

(54) DEFLECTING MAGNETIC FIELD SHIELD

(76) Inventors: Gordon Wadle, 1000 South St., Apt. A, Thomson, IL (US) 61285; William May, 10314 Deepbrook Dr., Riverview, FL (US) 33569

( * ) Notice: Subject to any disclaimer, the term of this patent is extended or adjusted under 35 U.S.C. 154(b) by 277 days.

(21) Appl. No.: 10/967,752

(22) Filed: Oct. 18, 2004

(65) Prior Publication Data

US 2006/0083931 A1    Apr. 20, 2006

(51) Int. Cl.
*B32B 15/00*    (2006.01)

(52) U.S. Cl. .............. 428/432; 428/457; 428/469; 428/468; 428/688

(58) Field of Classification Search .............. None
See application file for complete search history.

(56) References Cited

U.S. PATENT DOCUMENTS 5,786,785 A * 7/1998 Gindrup et al. .............. 342/1
5,892,476 A * 4/1999 Gindrup et al. .............. 342/1

* cited by examiner

*Primary Examiner*—Jennifer McNeil
*Assistant Examiner*—Gordon R. Baldwin
(74) *Attorney, Agent, or Firm*—Evelyn A. Defilló; Defillo & Associates, Inc.

(57) ABSTRACT

The present invention concerns a shielding material for a magnetic shield containing coal slag; silver powder; a mixture of calcium powder, magnesium powder, and zinc powder; and silica powder. The shielding material is in powder form. In another embodiment, the present invention contemplates adding nano-silver to the shielding material. The present invention is based on the concept that the magnetic field is actually "deflected" away from the area shielded. This is possible in view of the shielding materials used to produce the magnetic shield.

20 Claims, 1 Drawing Sheet

DEFLECTING MAGNETIC FIELD SHIELD

TECHNICAL FIELD

The present invention concerns a shielding material for a magnetic field, and more specific to a magnetic shield containing the shielding material.

BACKGROUND OF THE INVENTION

Magnetic fields are present around all electrical equipment and power lines. Although we cannot see or feel them, these fields interact with the components inside the equipments, causing a slow undulation of displayed images, frequently described as swimming, shimmy, jitter or even hula, making the screen illegible. In addition, magnetic interference may generate incorrect data, operator eyestrain, operator fatigue and disability.

Unlike X-rays and light rays, magnetic fields do not travel in straight lines. Magnetic field lines are continuous curves, emitting from a source of field and eventually returning to the point of origin.

Therefore, shielding is essential in electronic equipments and various kinds of equipments radiating undesired magnetic waves; thus, the radiation of the electromagnetic waves and invasion of the electromagnetic waves from the exterior is prevented.

A magnetic shield is traditionally made of a metallic material such as steel, iron, and nickel. Because metallic materials have a strong attraction for magnetic fields, the shield traps the magnetic force and diverts it around the equipment generating heat. In addition, lead, for example, is extremely hazardous, heavy, and is very expensive to produce. Steel requires massive amounts of refinement; it is heavy, and prone to corrosion. Alloys of steel, iron, copper and nickel are very expensive to produce and will corrode quickly. Furthermore, the cost of forming these materials into shapes for current shielding is high as well as dangerous.

As components of equipments are made more sensitive, susceptibility to magnetic waves increases dramatically; thus, the prior art developed a variety of materials for the shield.

The prior art shows the use of plates of a metal having high magnetic permeability and saturation magnetic flux density such as permalloy. Unfortunately, shields made of this material are bulky and heavy. In addition, in most of the cases, it is necessary to cut, bend, or even weld the plates. This is a laborious and expensive process.

Furthermore, the prior art shows the use of paramagnetic materials (e.g. titanium) to encapsulate and shield medical devices due to their low magnetic susceptibilities. These materials operate by deflecting electromagnetic fields. However, although paramagnetic materials are less susceptible to magnetization than ferromagnetic materials, they can also produce unwanted images due to eddy currents generated by externally applied magnetic fields, such as the radio frequency fields used in the MRI procedures. These eddy currents produce localized magnetic fields, which disrupt and distort the magnetic resonance image. In addition, since the paramagnetic materials are electrically conductive, the eddy currents produced in them can result in ohmic heating and injury to the patient or the medical device.

As steel, iron, and nickel are ferrous materials, saturation of these materials will occur after a period of time being exposed to magnetic fields.

In recent years, Mu-Metal is considered the premier shielding material for electronic devices. Mu-Metal is the generic name for a high-permeability, magnetically "soft" alloy used for magnetic shielding. It includes about 80% nickel and 15% iron, with the balance being copper, molybdenum or chromium, depending on the recipe being used. Unfortunately, Mu-Metal material is very expensive. In addition, the Mu-metal contains ferrous materials; thus, the shield will become saturated, becoming a magnet itself, thus not useful as a shield.

The present inventors have seen the necessity of providing a magnetic shielding material that overcomes the above disadvantages. In addition, the present inventors have seen the necessity of providing a magnetic shield that does not trap the magnetic forces. Furthermore, the present inventors have seen the necessity of providing an inexpensive magnetic shielding material for a magnetic shield.

SUMMARY OF THE INVENTION

It is an object of the present invention to provide a magnetic shielding material that overcomes the disadvantages of the shielding materials of the prior art.

It is an object of the present invention to provide a magnetic shield that does not trap the magnetic forces.

It is yet another object of the present invention to provide a magnetic shield made of a non-metallic, non-ferrous material.

It is yet another object of the present invention to provide substrate having a layer of the non-metallic material according to the present invention.

It is yet another object of the present invention to provide a magnetic shield which is of a simple and economical construction.

It is yet another object of the present invention to provide a lightweight magnetic shield.

It is yet another object of this invention to provide a magnetically shielded substrate which is shielded against strong magnetic fields.

The present invention concerns a shielding material for a magnetic shield comprising:
  A. coal slag,
  B. silver powder;
  C. a mixture of calcium powder, magnesium powder, and zinc powder; and
  D. silica powder.

The shielding material is in powder form and can be encapsulated into any form and shape desired.

The main advantage to the shielding material, according to the present invention, is this material is non-ferrous. Thus, the shield will not become saturated, attract a field or become ineffective.

The shielding material, according to the present invention, further contemplates using nano-silver.

The present invention also relates to a magnetic shield comprising:
  A. a substrate and, disposed above said substrate,
  B. a powdered shielding material comprising:
  C. coal slag,
  D. silver powder;
  E. a mixture of calcium powder, magnesium powder, and zinc powder; and
  F. silica powder.

The substrate may be substantially any size, any shape, any material, or any combination of materials. The shielding material(s) disposed on the substrate may be disposed on and/or in some or all of the substrate.

Furthermore, the present invention relates to a method for preparing a powdered shielding material for a magnetic shield comprising the steps of:

A. providing coal slag;
B. coating the coal slag with a silver powder;
C. adding silica powder;
D. adding a mixture of calcium powder, magnesium powder, and zinc powder.

Finally, the present invention contemplates adding nano-silver to the shielding material.

The magnetic shield of the present invention deflects the magnetic fields of high power magnets.

In one embodiment of the present invention, a thin layer of the shielding material is directly applied onto the surface of the substrate.

In another embodiment, the shielding material is suspended in an appropriate vehicle, and then mixed with sprayable coating materials.

The foregoing detailed description is intended to be illustrative and non-limiting. Many changes and modifications are possible in light of the above teachings. Thus, it is understood that the invention may be practiced than as otherwise specifically described herein and still be within the scope of the appended claims.

BRIEF DESCRIPTION OF THE DRAWINGS

For a more complete understanding of the nature and objects of the present invention, reference should be made to the following detailed description taken together with the accompanying drawings, in which.

DETAILED DESCRIPTION OF THE INVENTION

Figure 1:
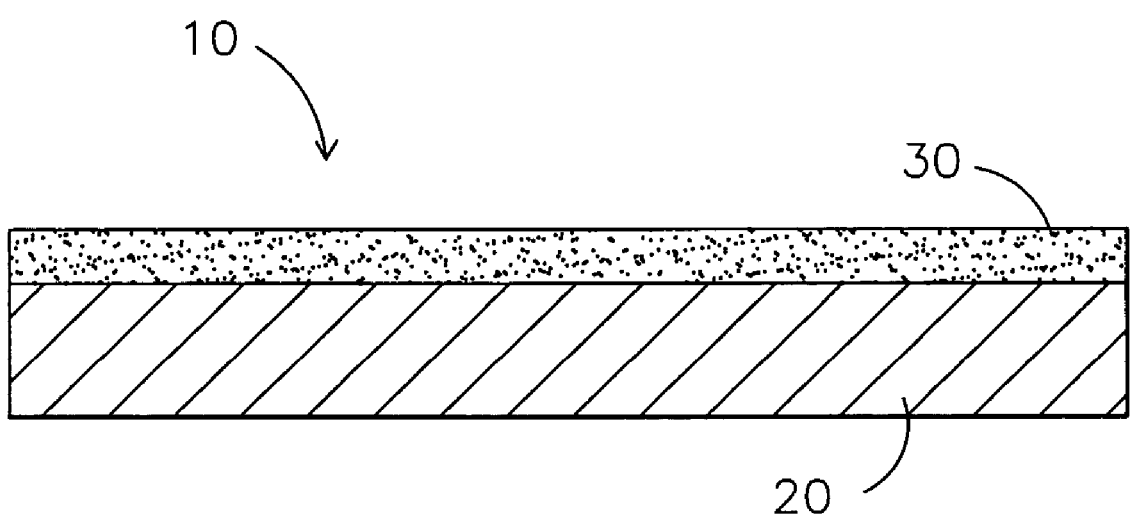
FIG. 1 shows a side view of the magnetic shield having a substrate and a layer of the non-ferrous material according to the present invention.

The present invention now will be described more fully hereinafter with reference to the accompanying drawings, in which some, but not all, embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

At the present time, the inventors do not understand the exact reactions that occur when the chemicals are mixed to form the shielding material of the present invention. The elements and the order of mixing were only achieved by preconceived notion and years of trial and error.

The magnetic shield of the present invention is based on the concept that the magnetic field is actually "deflected" away from the area shielded. This is possible in view of the shielding materials used to produce the magnetic shield.

The shielding material for a magnetic shield, according to the present invention, comprises:

A. insulating material,
B. non-magnetic, non-ferrous material;
C. a mixture of calcium powder, magnesium powder, and zinc powder; and
D. inorganic insulating material.

The shielding material is in powder form and can be encapsulated into any form and shape desired.

The following explains the purpose of addition of the shielding material components and the reasons for limiting the material compositions.

Insulating Material

The insulating material may be any oxide having electrically insulating properties. Use may be made of at least one of oxides of silicon, boron, phosphorus, tin, zinc, bismuth, alkali metal, alkaline earth metal, germanium, copper, aluminum, titanium, zirconium, vanadium, niobium, tantalum, chromium, manganese, tungsten, iron, chromium, cobalt, rare earth metals, coal slag, and molybdenum which can form a vitreous material.

The present invention preferably uses coal slag as the insulation material. Most preferably, the present invention uses a 30/60 coal slag.

Coal slag is made from quenched liquid coal slag and fresh water washed, this product is extremely inert, has a low moisture content, a high degree of etch for permanent bonding of coatings, is ready used, is economical, and leaves minimum dust. Containing virtually no free or crystalline silica, coal slag is one of the safest and most inexpensive insulation materials.

Coal slag generally has the following composition:
$SiO_2$, preferably in the range of about 20 to 60 weight percent, more preferably in the range of about 40 to 55 weight percent;
$Al_2O_3$, preferably in the range of about 10 to 35 weight percent, more preferably in the range of about 15 to 30 weight percent;
$Fe_2O_3$ and FeO, preferably in the range of about 5 to 35 weight percent, more preferably in the range of about 10 to 20 weight percent;
CaO, preferably in the range of about 1 to 20 weight;
$Na_2O$ and $K_2O$, preferably in the range of about 0.1 to 4 weight percent.

Coal slag has conductivity at 230° C. (cal/s-cm-° C.) of less than 25 micron Siemens. Thus, the material may be use as insulator.

The present invention contemplates using from about 20 to about 50 weight percent of a coal slag, preferably 35 weight percent.

Non-magnetic Material

The non-magnetic metal material is not limited to a specific material, but may be selected from various kinds of non-magnetic metal materials. However, particularly preferable materials are: metals, such as Sc, Ti, Cu, Zn, Y, Zr, Ru, Rh, Pd, Ag, Cd, Re, Os, Ir, Pt, Au, Ti and Pb, and non-magnetic alloys containing them.

The present invention preferably uses silver. Most preferably, a 6μ silver powder.

As known by a person skilled in the art, silver has sterilizing, anti-microbial, deodorizing, antistatic, and electromagnetic shielding effects.

Silver is a lustrous, white metal, more ductile and malleable than any other metal, excluding gold. Silver is the best reflector of visible light known until air causes it to tarnish. In pure air and in water, it is stable.

The silver powder (damp) is added to improve the smoothness of the coal slag (dry) and to form the base layer on the shielding material. Furthermore, the silver powder is added to the insulation material to make the particle surface reflective.

The present invention contemplates using from about 4 to about 30 weight percent of a silver powder, preferably 15 weight percent.

Insulating Inorganic Material

The insulating inorganic material used in the surface of the shielding material is not limited specifically. Any material may be used if it has electric insulation properties. For example, silica fine powder or alumina fine powder may be used. Especially, the silica fine powder is preferably used.

Silica is noncombustible, colorless or white, tasteless "crystals". It occurs naturally in the crystalline and amorphous forms. The specific gravity and melting point depend on the crystalline form. Silica is known to occur in 17 crystalline phases or modes and five amorphous phases.

Of the silica fine powder, spherical silica fine powder, triturated silica fine powder, granular type silica fine powder, and the like, may be used. In addition, from the point of view of fine particle size, the silica fine powder, having an average primary particle size of 1-1,000 nm, may be used. Especially, the silica fine powder having 250 sieve screen size is preferably used.

The present invention contemplates using from about 15 to about 45 weight percent of a silica powder, preferably 25 weight percent.

Pharmacy Grade Calcium, Magnesium and Zinc Finely Ground to a Powder.

Any over the counter pharmacy grade calcium, magnesium, or zinc may be use in the present invention.

The chemical must be ground to a fine powder before adding to the shielding material according to the present invention.

The present invention contemplates using from about 15 to about 45 weight percent of a mixture of calcium powder, magnesium powder, and zinc powder, preferably 25 weight percent.

The mixture contains 60% of calcium, 28% of magnesium, and 12% zinc. This mixture is preferably 25% weight of the shielding material according to the present invention.

Nano-material

In one embodiment of the present invention, the invention contemplates coating the shielding material with a nano-material.

In general, and as is known to those skilled in the art, nano-material is material which has an average particle size less than 100 nanometers and, preferably, in the range of from about 2 to 50 nanometers.

The present invention preferably uses nano-silver. Nano Silver has upgraded beneficial effects of silver by making it into very small particles of one billionth of a meter. This material is environment-friendly and not toxic.

The nano-silver has the ability to deflect electromagnetic fields while remaining electrically non-conductive.

The nano-silver, when placed on an object, is capable of deflecting electromagnetic fields, thereby protecting sensitive internal components, while also preventing the formation of eddy currents in the object.

The present invention contemplates using from about 3 to about 10 weight percent of nano-silver, preferably 7 weight percent.

Magnetic Shield

FIG. 1 is a side view of the magnetic shield according to the present invention. The magnetic shield 10 comprises:

A. a substrate 20 and, disposed above said substrate,
B. a shielding material 30 comprising:
C. coal slag,
D. silver powder;
E. a mixture of calcium powder, magnesium powder, and zinc powder; and
F. silica powder.

The substrate may be substantially any size, any shape, any material, or any combination of materials. The shielding material(s) disposed on and/or in such substrate may be disposed on and/or in some or all of such substrate.

The actual process for producing the shield material is very simple and safe. No extreme heat is required. No advanced mix processing is required.

In one embodiment of the present invention a thin layer (in the figure, shown by hatching or dots) of the shielding material is directly applied onto the surface of the substrate.

In another embodiment, the shielding material is suspended in an appropriate vehicle, and then mixed with a sprayable, brushable, or rollable coating.

Objects and advantages of this invention are further illustrated by the following examples, but the particular materials and amounts thereof recited in these examples, as well as other conditions and details, should not be construed to unduly limit this invention. All parts and percentages are by weight unless otherwise indicated.

EXAMPLE 1

Step 1. 35 grams of 30/60 coal slag was provided. The coal slag contained 25% Aluminum Oxide, 25% Iron Oxide, and 50% Mineralized Glass.

Step 2. The coal slag was coated with 15 grams of a six micron (6 μm) silver powder. The silver powder was slightly moistened and adhered to the coal slag.

Step 3. Then, 25 grams of white silica powder—250 sieve screen was added to the top of the silver powder. The silica powder adhered to the silver powder.

Step 4. Finally, 25 grams of a mixture of pharmacy grade calcium, magnesium, and zinc powder. The 25% of the mixture contains 60% weight of calcium, 28% weight of magnesium, and 12% weight of zinc.

The three elements of step 4 are pharmacy grade and were purchased over the counter at a local drug store in tablet form and then finely ground.

Results of the test for example 1:

A test was done using a 2½ ounce round spherical container ¾" diameter×1½" long of iron filings, a 28 lb pull ¾" diameter×½" long rare earth magnet, and one ⅜" thick 4"×4" square sheet of each of the following materials:

A. Plastic
B. Lead
C. Stainless Steel
D. Copper
E. the sheet covered with the shielding material of the present invention.

The test went as follows:

Each individual sheet of shielding material was set upright. The 28 lb rare earth magnet was held against one side of the shielding material and the iron fillings against the other side. The magnet and the iron fillings were held against each side of the shielding material listed above A-E in the same manner.

The magnet attraction from the 28 lb magnet to the iron fillings on shielding sheets A-D was strong enough to hold the iron fillings and the magnet in place.

Test results with sheet E. (present invention). The shield element E deflected the magnetic pull of the 28 lb rare earth magnet preventing the attraction to the iron fillings, thus the magnet and the iron filing fall down due the earth gravitation pull.

The shielding material is in powder form and can be encapsulated into any form and shape desired.

EXAMPLE 2

Step 1. 33 grams of 30/60 coal slag was provided. The coal slag contained 25% Aluminum Oxide, 25% Iron Oxide, and 50% Mineralized Glass.

Step 2. The coal slag was coated with 15 grams of a six micron (6 μm) silver powder. The silver powder was slightly moistened and adhered to the coal slag.

Step 3. Then, 25 grams of white silica powder—250 sieve screen was added to the top of the silver powder. The silica powder adhered to the silver powder.

Step 4. Finally, 20 grams of a mixture of pharmacy grade calcium, magnesium, and zinc powder. The 25% of the mixture contains 60% weight of calcium, 28% weight of magnesium, and 12% weight of zinc. The 20% of the mixture contains 60% weight of calcium, 28% weight of magnesium, and 12% weight of zinc.

The three elements of step 4 are pharmacy grade and were purchased over the counter at a local drug store in tablet form and then finely ground.

Step 5. 7 grams of nano-silver were mixed with the mixture of step 4.

Results of the test for example 2:

A test was done using a 2½ ounce container of iron filings, a 28 lb pull rare earth magnet, and one ⅜" thick 4"×4" square sheet each of the following materials:

A. Plastic
B. Lead
C. Stainless Steel
D. Copper
E. the sheet covered with the shielding material of the present invention.

For the shielding material E, a ¼" thick 4"×4" square sheet was used. The sheet thickness was reduced from ⅜" to ¼". This included the plastic sidewall that held the shielding material place while testing. Each wall thickness of about 1/32" actually decreased the true thickness of the shielding material to 3/16". Thus, the actual thickness of the shielding material on the substrate was at about ½ the thickness of the material that was tested, with the same results as the first test.

The test went as follows:

Each individual sheet of shielding material was set upright. The 28 lb rare earth magnet was held against one side of the shielding material, and the iron fillings against the other side. The magnet and the iron fillings were held against each side of the shielding material listed above A-E in the same manner.

The magnet attraction from the 28 lb magnet to the iron fillings on shielding sheets A-D was strong enough to hold the iron fillings and the magnet in place.

Test results with sheet E. (present invention). The shield element E deflected the magnetic pull of the 28 lb rare earth magnet preventing the attraction to the iron fillings; thus, the magnet and the iron fillings fall down due to the earth's gravitation pull.

The shielding material is in powder form and can be encapsulated into any form and shape desired.

Adding nano-silver to the mixture of example 1 shows 8-10% improvement for the magnetic field deflection over original formula mixture.

EXAMPLE 3

The objective of the experiment was to create a static distortion on a radio.

An AM radio and another electronic device were set approximately 12 inches apart.

An adhesive was sprayed on a plain sheet of paper, and the shielding material of example 1 was applied to the paper.

The paper was then lowered between the two devices.

The result was a very noticeable reduction in the static on the radio.

The magnetic shield, according to the present invention, is of much lighter weight than the ferrous shields of the prior art.

The magnetic shield of the present invention may be used with:

MRI units for shielding of errant and stray fields;
power transfer for AC power line transformers;
security installations, conference rooms, command centers, and test facilities;
electronic equipments such as computers and other sensitive systems; and
auto industry for everything from propulsion to electronic protection.

The main advantage to this shield is that it is non-ferrous. By being non-ferrous, the shield will not become saturated and become ineffective. Because of the non-ferrous makeup of the magnetic shield of the present invention, there will be no loss of power from the magnet(s) when used next to the shield.

In addition, the present invention contemplates the use of the magnetic shield in outer space. With the magnetic shield deflecting the magnetic fields towards the core of the earth by means of gravity, the use in space would be far superior. With no gravity to deal with, the deflection would not be focused downward. This may very well create a true "reflection" shield.

The use of the shielding material in radiological work has many possibilities. As a deflector of magnetic fields, the shield could have the same effect on radioactive material as well. This is a very distinct possibility. Further testing would be required to establish the impact in this field.

The major advantage of the magnetic shield of the present invention is that it is environmentally safe. The shield itself is formulated from elements that are earth friendly and will not hurt the environment.

Many modifications and other embodiments of the invention set forth herein will come to mind to one skilled in the art to which this invention pertains, having the benefit of the teachings presented in the foregoing descriptions and the associated drawings. Therefore, it is to be understood that the invention is not to be limited to the specific embodiments disclosed, and that modifications and other embodiments are intended to be included within the scope of the appended claims. Although specific terms are employed herein, they are used in a generic and descriptive sense only, and not for purposes of limitation.

What is claimed is:

1. A shielding material for a magnetic shield comprising:
   coal slag,
   silver powder;
   a mixture of calcium powder, magnesium powder, and zinc powder; and
   silica powder;
   wherein the shielding material is in powder form.

2. The shielding material according to claim 1, wherein the coal slag is 30/60 sized coal slag.

3. The shielding material according to claim 1, wherein the silver powder has a size of 6 μm.

4. The shielding material according to claim 1, wherein the silica powder is white silica powder having 250 sieve screen.

5. The shielding material according to claim 1, further comprising nano-sized silver.

6. A shielding material for a magnetic shield comprising:
from about 20 to about 50 weight percent of a coal slag,
from about 40 to about 30 weight percent of a silver powder;
from about 15 to about 45 weight percent of a mixture of calcium powder, magnesium powder, and zinc powder; and
from about 15 to about 45 weight percent of a silica powder.

7. A magnetic shield comprising:
a substrate and, disposed above said substrate,
a powdered shielding material comprising:
coal slag,
silver powder;
a mixture of calcium powder, magnesium powder, and zinc powder; and
silica powder.

8. The magnetic shield according to claim 7, wherein the shielding material further comprises nano-sized silver.

9. The magnetic shield according to claim 7, wherein said shield is contiguous with said substrate.

10. The magnetic shield according to claim 7, wherein said substrate is a foil.

11. The magnetic shield according to claim 7, wherein said substrate is comprised of ceramic material.

12. The magnetic shield according to claim 7, wherein said substrate is comprised of glass.

13. The magnetic shield according to claim 7, wherein said substrate is in the form of a cylinder.

14. The magnetic shield according to claim 7, wherein said substrate is in the shape of a sphere.

15. A method for preparing a shielding material for a magnetic shield comprising the steps of:
providing coal slag;
coating the coal slag with a silver powder;
adding silica powder;
adding a mixture of calcium powder, magnesium powder, and zinc powder.

16. A method according to claim 15 further comprising adding nano-sized silver.

17. A method according to claim 15, wherein the shielding material is suspended in an appropriate vehicle, and then mixed with a sprayable coating material.

18. A shielding material for a magnetic shield comprising:
35 weight percent of a coal slag,
15 weight percent of a silver powder;
25 weight percent of a mixture of calcium powder, magnesium powder, and zinc powder; and
25 weight percent of a silica powder.

19. A shielding material for a magnetic shield comprising:
from about 20 to about 50 weight percent of a coal slag,
from about 4 to about 30 weight percent of a micrometer sized silver powder;
from about 15 to about 45 weight percent of a mixture of calcium powder, magnesium powder, and zinc powder;
from about 15 to about 45 weight percent of a silica powder; and
from about 3 to about 10 weight percent of nano-sized silver powder.

20. A shielding material for a magnetic shield comprising:
33 weight percent of a coal slag,
15 weight percent of a micrometer sized silver powder;
7 weight percent of a nano-sized silver;
20 weight percent of a mixture of calcium powder, magnesium powder, and zinc powder; and
25 weight percent of a silica powder.

* * * * *